United States Patent
Peng et al.

(10) Patent No.: US 6,835,606 B2
(45) Date of Patent: Dec. 28, 2004

(54) LOW TEMPERATURE POLYSILICON THIN FILM TRANSISTOR AND METHOD OF FORMING POLYSILICON LAYER OF SAME

(75) Inventors: Chia-Tien Peng, Hsinchu Hsien (TW); Huan-Chao Wu, Hsinchu Hsien (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 10/604,858

(22) Filed: Aug. 22, 2003

(65) Prior Publication Data
US 2004/0197968 A1 Oct. 7, 2004

(30) Foreign Application Priority Data
Apr. 2, 2003 (TW) ........................... 92107490 A (51) Int. Cl.$^7$ ............................................. H01L 21/00
(52) U.S. Cl. ..................... 438/154; 438/198; 438/377
(58) Field of Search ............................... 438/154, 162, 438/166, 187, 198, 280, 377

(56) References Cited

U.S. PATENT DOCUMENTS

| | | | | |
|---|---|---|---|---|
| 5,382,537 A | * | 1/1995 | Noguchi | 438/162 |
| 5,550,070 A | * | 8/1996 | Funai et al. | 438/486 |
| 5,773,309 A | * | 6/1998 | Weiner | 438/166 |

* cited by examiner

Primary Examiner—Phuc T. Dang
(74) Attorney, Agent, or Firm—Jianq Chyun IP Office (57) ABSTRACT

A low temperature polysilicon thin film transistor and a method of forming the polysilicon layer inside the thin film transistor. An amorphous silicon layer is formed over a panel. The panel has a display region and a peripheral circuit region. A metallic layer is formed over a portion of the amorphous silicon layer in the peripheral circuit region. A crystallization process is performed to transform the amorphous silicon layer in the peripheral circuit region into a polysilicon layer. Thereafter, an excimer laser annealing process is performed to increase the grain size of the polysilicon layer in the peripheral circuit region and, at the same time, transform the amorphous silicon layer in the display region into a polysilicon layer. Since the average grain size of the polysilicon layer in the peripheral circuit region is larger, electron mobility is increased as demanded. Similarly, since the average grain size of the polysilicon layer in the display region is smaller, leakage current is decreased as demanded.

27 Claims, 6 Drawing Sheets

LOW TEMPERATURE POLYSILICON THIN FILM TRANSISTOR AND METHOD OF FORMING POLYSILICON LAYER OF SAME

CROSS REFERENCE TO RELATED APPLICATIONS

This application claims the priority benefit of Taiwan application serial no. 92107490, filed Apr. 2, 2003.

BACKGROUND OF INVENTION

1. Field of Invention

The present invention relates to a method of forming a low temperature polysilicon (LTPS) thin film transistor (TFT). More particularly, the present invention relates to a method of forming the polysilicon layer inside a low temperature polysilicon thin film transistor.

2. Description of Related Art

An outcome of the rapid progress in high-tech products is the popularity of video products such as digital video or imaging devices in our daily life. To be useful, these digital video and imaging devices must provide a high-quality display so that a user can operate a controlling device after reading some important information disseminated from the display.

At present, liquid crystal displays (LCD) are the most common type of displays in the market with applications in desktop computers, personal computers, game centers and monitors. The principal driving devices for a liquid crystal display (LCD) are thin film transistors (TFT). Because the amorphous silicon layer inside the amorphous silicon thin film transistors can be grown at a relatively low temperature of between 200° C. to 300° C., the amorphous silicon thin film transistors are frequently used in liquid crystal displays. However, the electron mobility of amorphous silicon is lower than 1 cm$^2$/V.s. Hence, amorphous silicon thin film transistor can hardly match the speed desired from a high-speed device. On the other hand, the polycrystalline silicon (or polysilicon) thin film transistor has electron mobility and low temperature sensitivity higher than the amorphous silicon thin film transistor. In other words, the polysilicon thin film transistors are better attuned to high-speed operations. Yet, the process of transforming amorphous silicon into polysilicon layer often requires an annealing temperature in excess of 600° C. Therefore, expensive quartz substrate instead of glass substrate must be used. Moreover, it is difficult to fabricate a quartz substrate with a moderately large size. Hence, the size of a liquid crystal display deploying polysilicon thin film transistors is often limited to between 2 to 3 inches on each side.

To reduce production cost, glass substrates are commonly used for producing liquid crystal displays so that the temperature for fabricating the polysilicon layer must be reduced to below 500° C. Because of this, a number of methods for fabricating a polysilicon layer at a reduced temperature are developed, among which, the excimer laser annealing (ELA) and the metal induced crystallization (MIC) are the most prominent. Since these two methods are capable of producing high-quality, contaminant-free and low-defect-density polysilicon layer, the polysilicon thin film transistors fabricated using such low temperature process are often called 'the low temperature polysilicon thin film transistors' or 'LTPS-TFT'. In addition, due to the high electron mobility of the polysilicon, the peripheral circuit region lying outside the display region are formed together with the thin film transistor array in the same process.

The metal induced crystallization (MIC) process relies on the lateral growth of crystals. First, a metallic layer for catalyzing the crystallization of an amorphous silicon layer is formed before or after the process of depositing amorphous silicon. Thereafter, a low temperature annealing process is performed to produce a polysilicon layer. Aside from speeding up the transformation of amorphous silicon into polysilicon in the MIC process, the metallic layer also results in the formation of a metal silicide layer after the annealing operation. The metal silicon layer is properly set by controlling the relationship between the direction of lateral growth and the direction of extension of the source-channel-drain chain. In general, a perpendicular relation between the aforementioned directions is useful for processing a pixel region while a parallel relation between the aforementioned directions is useful for processing a peripheral circuit region. Nevertheless, one major drawback of the MIC method is the production of too many defects so that a subsequent high-temperature annealing operation such as a rapid thermal process or an excimer laser annealing is often required. Consequently, most polysilicon thin film transistors are fabricated using the laser excimer annealing method.

However, in a conventional active matrix liquid crystal display, the low temperature polysilicon thin film transistors of the peripheral circuit region must have high electron mobility and on-state current. On the other hand, the low temperature polysilicon thin film transistors of the pixel region must have a low leakage current. The laser excimer annealing process can produce polysilicon layer that satisfy the demand in the pixel region or the peripheral circuit region only but not both.

SUMMARY OF INVENTION

Accordingly, one object of the present invention is to provide a low temperature polysilicon thin film transistor and a method of forming the polysilicon layer so that polysilicon layers with larger grain size are formed inside a peripheral circuit region and polysilicon layers with smaller grain size are formed inside a display region.

To achieve these and other advantages and in accordance with the purpose of the invention, as embodied and broadly described herein, the invention provides a method of forming a polysilicon layer. First, an amorphous silicon layer is formed over a panel. The panel has a display region and a peripheral circuit region. Thereafter, a metallic layer is formed over a portion of the amorphous silicon layer in the peripheral circuit region. A crystallization process is carried out to transform the amorphous silicon layer in the peripheral circuit region into a polysilicon layer. An excimer laser annealing process is performed to increase the size of crystals within the polysilicon layer in the peripheral circuit region and, at the same time, transform the amorphous silicon layer in the display region into a polysilicon layer. The crystals within the polysilicon layer in the peripheral circuit region have an average size greater than the crystals within the polysilicon layer in the display region.

This invention also provides a method of fabricating a low temperature thin film transistor on a panel. The panel has a display region and a peripheral circuit region. First, an amorphous silicon layer is formed over the panel. Thereafter, using a mask, a metal induced crystallization process is performed to transform the amorphous layer in the peripheral circuit region into a polysilicon layer. After removing the mask, an excimer laser annealing operation is carried out to increase the size of crystals within the polysilicon layer in the peripheral circuit region and, at the same time, transform the amorphous silicon layer in the display region into a polysilicon layer. The polysilicon layer with large crystals is patterned to form a plurality of island polysilicon layers. A channel region is formed in each island polysilicon layer and a doped source/drain region is formed on each side of the channel region. Finally, a gate is formed over each channel region.

In this invention, a metal induced crystallization followed by a post excimer laser annealing is used to fabricate the polysilicon layer in the peripheral circuit region. The post excimer laser annealing operation is also used to form the polysilicon layer in the display region. With this processing sequence, polysilicon layers with a larger gain size is produced in the peripheral circuit region while polysilicon layers with a smaller grain size is produced in the display region. Hence, the properties of the polysilicon thin film transistors in the peripheral circuit region and the display region are optimized.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Reference will now be made in detail to the present preferred embodiments of the invention, examples of which are illustrated in the accompanying drawings. Wherever possible, the same reference numbers are used in the drawings and the description to refer to the same or like parts.

Figure 1A:
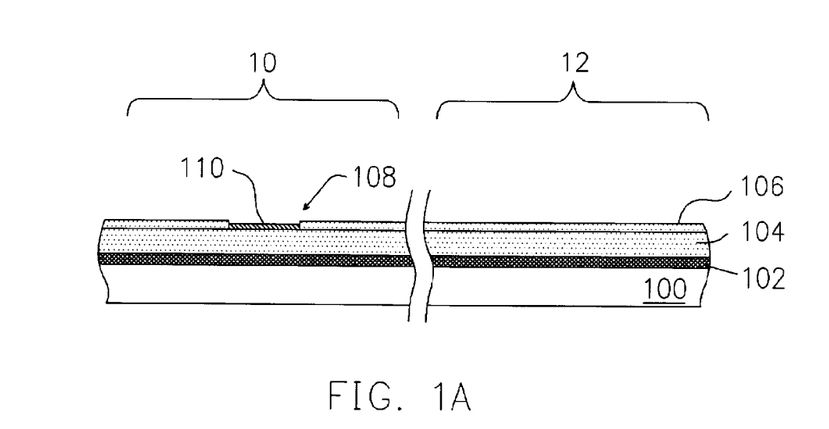
FIGS. 1A to 1D are schematic cross-sectional views showing the progression of steps for fabricating the polysilicon layer of a low temperature polysilicon thin film transistor according to one preferred embodiment of this invention.

FIGS. 1A to 1D are schematic cross-sectional views showing the progression of steps for fabricating the polysilicon layer of a low temperature polysilicon thin film transistor according to one preferred embodiment of this invention. First, as shown in FIG. 1A, a buffer layer 102 is formed over a panel 100. The buffer layer 102 is a stack layer comprising a silicon nitride layer and a silicon oxide layer, for example. The buffer layer 102 serves to increase the adhesive strength between the panel 100 and a subsequently formed polysilicon layer and prevent any metallic ions in the panel 100 from contaminating the polysilicon layer. Thereafter, an amorphous silicon layer 104 is formed over the buffer layer 102. The panel has a peripheral circuit region 10 and a display region 12. A metal induced crystallization (MIC) process is next carried out to transform the amorphous silicon layer 104 in the peripheral circuit region 10 into a polysilicon layer. To form the polysilicon layer in the peripheral circuit region 10, for example, a mask layer 106 having an opening that exposes a portion of the amorphous silicon layer 104 in the peripheral circuit region 10 is formed. A metallic layer 110, for example, a nickel layer is formed over the exposed amorphous silicon layer 104 within the opening 108.

Figure 1B:
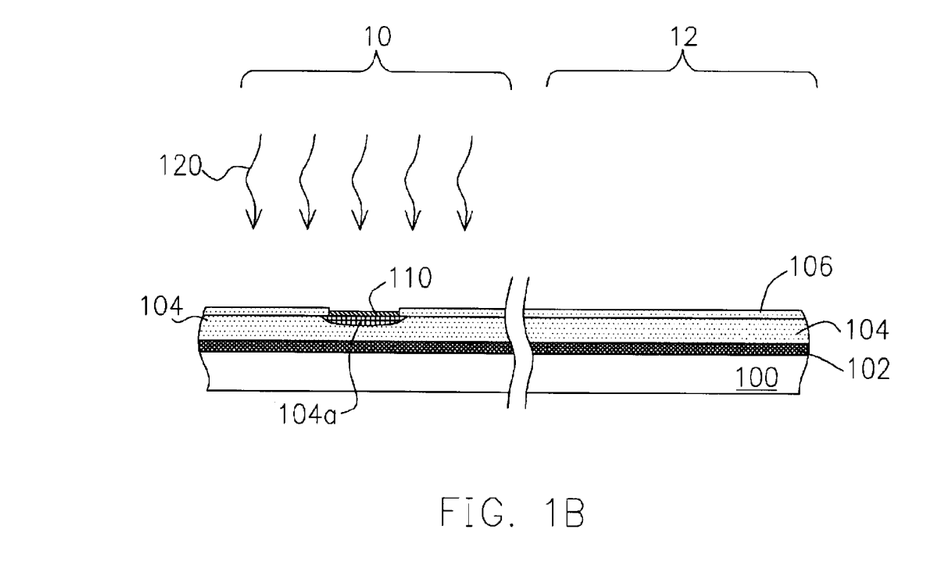

Thereafter, as shown in FIG. 1B, a crystallization process 120 is carried out to transform the amorphous silicon layer 104 in the peripheral circuit region 10 into a polysilicon layer 104a. The crystallization process 120 includes a solid phase crystallization process, for example. The crystallization of the amorphous silicon layer 104 in the peripheral circuit region 10 starts out in the region adjacent to the metallic layer 110 and progresses until a complete polysilicon film layer is produced.

Figure 1C:
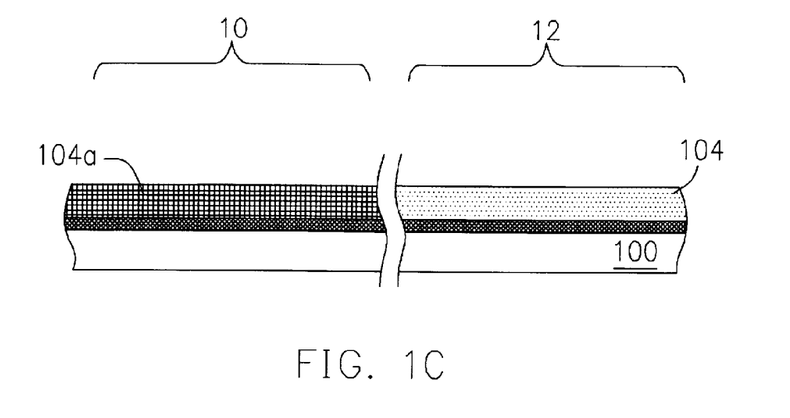

As shown in FIG. 1C, after forming the polysilicon layer 104a in the peripheral circuit region 10, the mask 106 is removed. Since the amorphous silicon layer 104 in the display region 12 is shielded by the mask 106 and has no metallic layer thereon to induce crystallization and no shielding mask thereon, the amorphous silicon layer 104 in the display region 12 still has an amorphous structure.

Figure 1D:
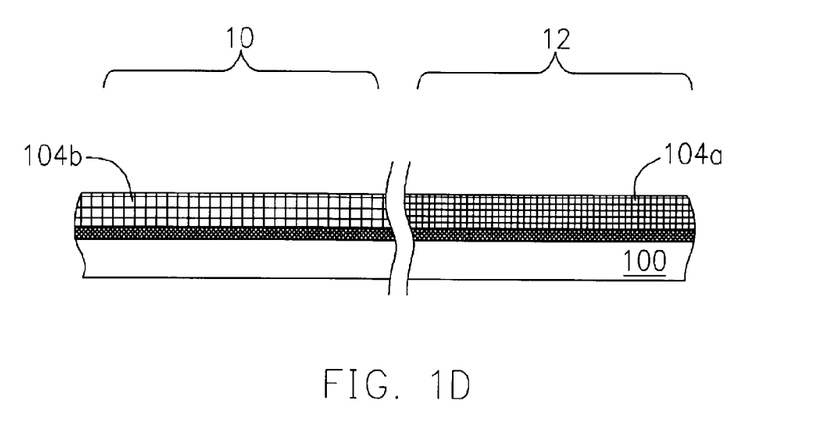

As shown in FIG. 1D, an excimer laser annealing process is performed so that the grain size of the polysilicon layer 104a in the peripheral circuit region 10 is increased and the number of defects is reduced to form a polysilicon layer 104b. Meanwhile, the excimer laser annealing operation also initiates the transformation of the amorphous silicon layer 104 in the display region 12 into a polysilicon layer 104a. Due to a difference in the processing condition, the polysilicon layer 104a in the display region 12 has an average grain size smaller than the polysilicon layer 104b in the peripheral circuit region 10.

Figure 2A:
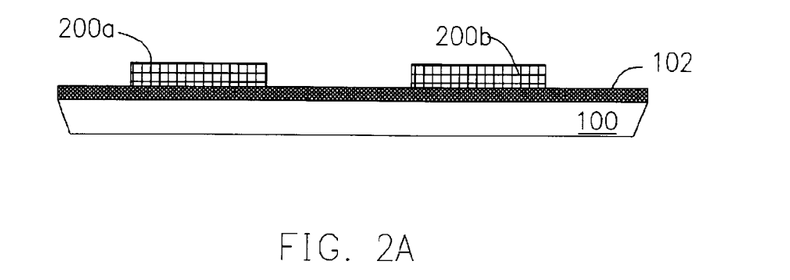
FIGS. 2A to 2H are schematic cross-sectional views showing the progression of steps for fabricating a low temperature polysilicon thin film transistor in the peripheral circuit region shown in FIG. 1D according to one preferred embodiment of this invention.

FIGS. 2A to 2H are schematic cross-sectional views showing the progression of steps for fabricating a low temperature polysilicon thin film transistor in the peripheral circuit region shown in FIG. 1D according to one preferred embodiment of this invention. As shown in FIG. 2A, the polysilicon layer 104a (FIG. 1D) with large grain size is patterned to form a plurality of island polysilicon layers 200a, 200b. The island polysilicon layer 200a is a section set aside for forming a P-type thin film transistor and the island polysilicon layer 200b is another section set aside for forming an N-type thin film transistor. In the following example, the method for forming a P-type and an N-type thin film transistor simultaneously is described. Obviously, this invention is not limited to the simultaneously fabrication of P-type and N-type thin film transistors.

Figure 2B:
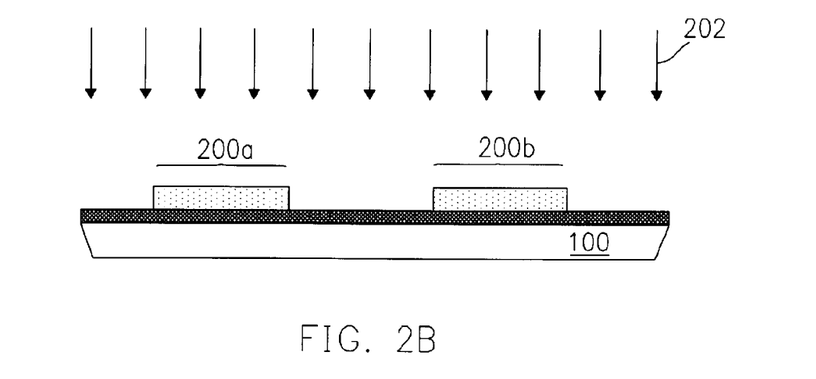

As shown in FIG. 2B, a channel doping operation 202 is carried out to form a doped region in various island polysilicon layers 200a, 200b.

Figure 2C:
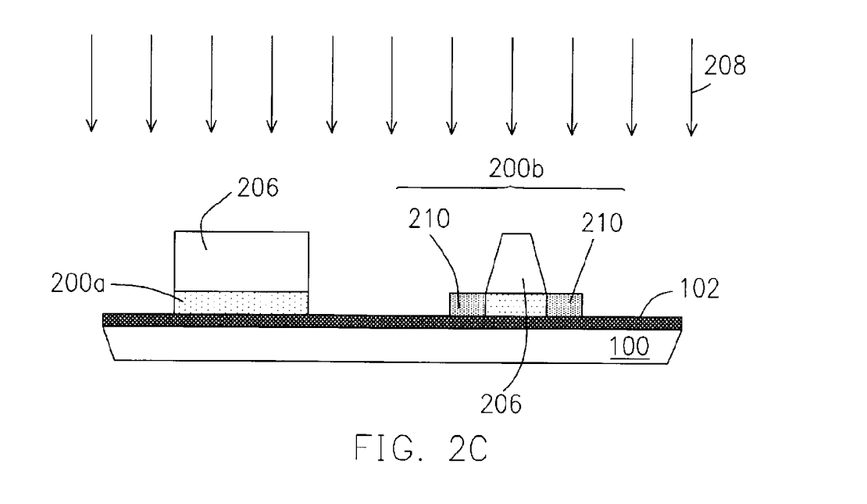

As shown in 2C, a patterned photoresist layer 206 is formed over the panel 100 to cover the island polysilicon layer 200a and a portion of the island polysilicon layer 200b so that a portion of the upper surface on each side of the island polysilicon layer 200b is exposed. Thereafter, an n$^+$ doping operating 208 is carried out to form a doped source/drain region 210 of an N-type thin film transistor on each side of the island polysilicon layer 200b.

Figure 2D:
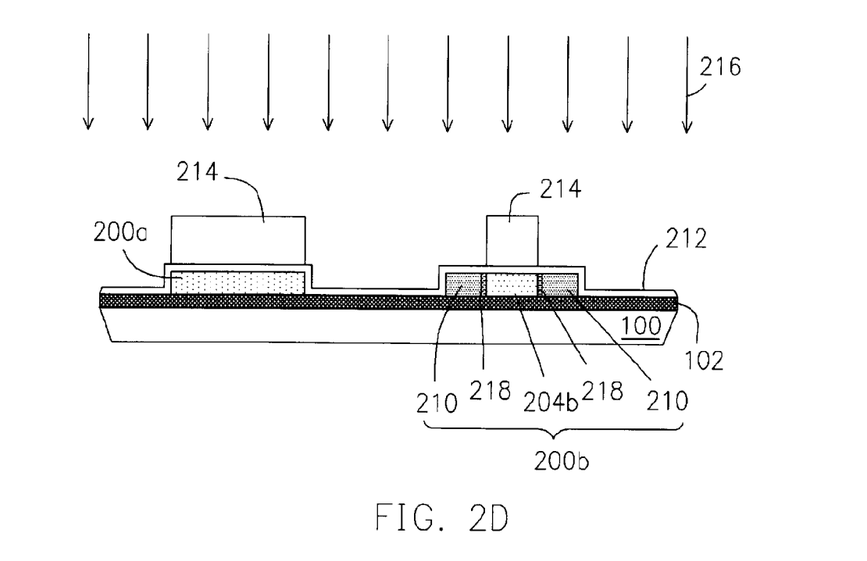

As shown in FIG. 2D, the patterned photoresist layer 206 is removed. Thereafter, a gate insulation layer 212 is formed over the island polysilicon layers 200a, 200b and the buffer layer 102. Another patterned photoresist layer 214 is formed over the gate insulation layer 212 to cover the island polysilicon layer 200a and a portion of the island polysilicon layer 200b so that the region close to the doped source/drain region 210 is exposed. An n$^-$ doping operation 216 is carried out to form lightly doped drain regions 218 and define a channel region 204b between the lightly doped drain regions 218 for the N-type thin film transistor.

Figure 2E:
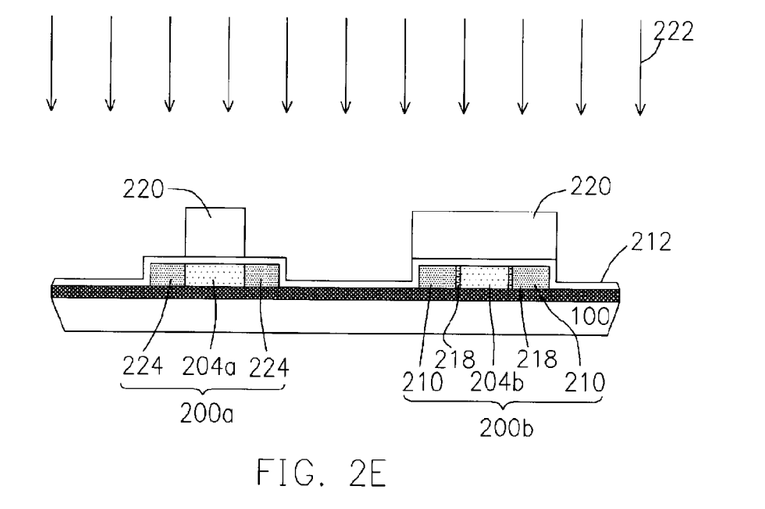

As shown in FIG. 3E, the patterned photoresist layer 214 is removed. Another patterned photoresist layer 220 is formed over the gate insulation layer 212 to cover the island polysilicon layer 200b and a portion of the polysilicon layer 200a so that the upper surface on each side of the island polysilicon layer 200b is exposed. Thereafter, a $p^+$ doping operation 222 is carried out to form doped source/drain regions 224 and define a channel 204a between the doped source/drain region 224 for a P-type thin film transistor.

Figure 2F:
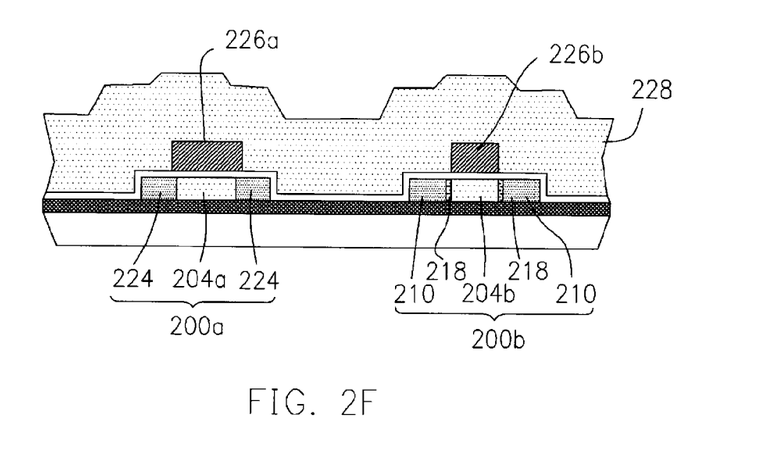

As shown in FIG. 2F, the patterned photoresist layer 220 is removed and then gates 226a and 226b are formed over the channel regions 204a and 204b respectively. Thereafter, an inter-layer dielectric layer 228 is formed over the panel 100 to cover the island polysilicon layers 200a, 200b and the gates 226a, 226b.

Figure 2G:
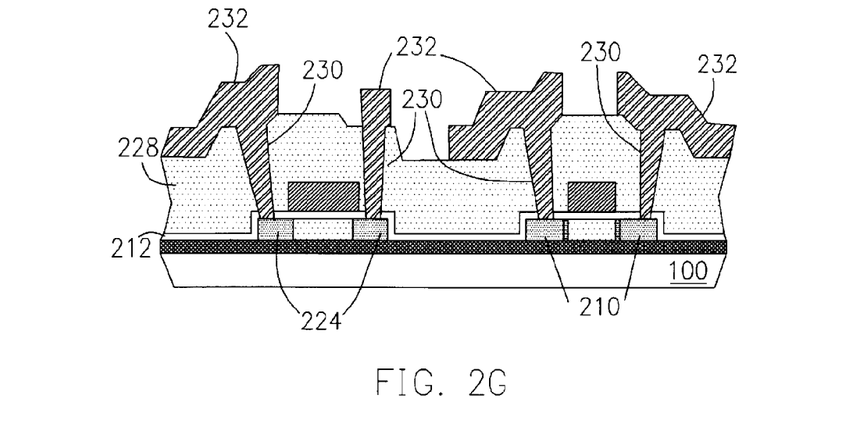

As shown in FIG. 2G, a plurality of openings 230 is formed in the inter-layer dielectric 228 and the gate insulation layer 212 to expose the doped source/drain regions 210 and 224. Thereafter, a plurality of source/drain contact metallic layer 232 is formed over the inter-layer dielectric 228 so that the source drain contact metallic layers 232 are electrically connected to the doped source/drain regions 210 and 224 through the openings 230.

Figure 2H:
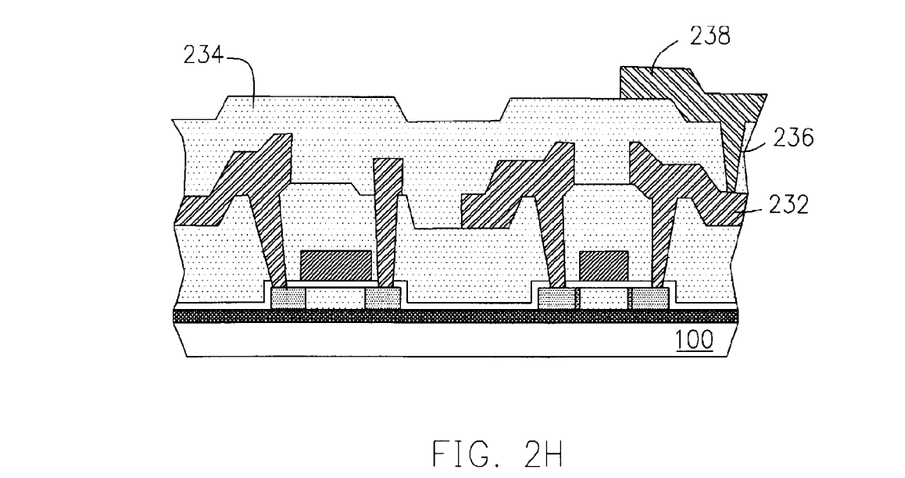

As shown in FIG. 2H, a passivation layer 234 is formed over the panel 100. Thereafter, an opening 236 is formed in the passivation layer 234 to expose a portion of the source/drain contact metallic layer 232. The passivation layer 234 is a silicon nitride layer, for example. Finally, a pixel electrode 238 is formed over the passivation layer 234 such that the pixel electrode 238 and a portion of the source/drain contact metallic layer 232 are electrically connected through the opening 236. The pixel electrode is fabricated using a material including, for example, indium-tin oxide (ITO). In this embodiment, since the island polysilicon layer 200a and 200b contains large grain size, the demand for high electron mobility and on-state current for the low temperature thin film transistors in a peripheral circuit region is met.

In this invention, a metal induced crystallization followed by a post excimer laser annealing is used to fabricate the polysilicon layer in the peripheral circuit region. The post excimer laser annealing operation is also used to form the polysilicon layer in the display region. With this processing sequence, polysilicon layers with a larger gain size is produced in the peripheral circuit region while polysilicon layers with a smaller grain size is produced in the display region. Hence, the properties of display panel are optimized.

It will be apparent to those skilled in the art that various modifications and variations can be made to the structure of the present invention without departing from the scope or spirit of the invention. In view of the foregoing, it is intended that the present invention covers modifications and variations thereof provided they fall within the scope of the following claims and their equivalents.

What is claimed is:

1. A method of forming a polysilicon layer, comprising the steps of:
    forming an amorphous layer over a panel having a display region and a peripheral circuit region;
    forming a metallic layer over a portion of the amorphous silicon layer in the peripheral circuit region;
    performing a crystallization process to transform the amorphous silicon layer in the peripheral circuit region into a first polysilicon layer; and
    performing an excimer laser annealing operation to transform the first polysilicon layer in the peripheral circuit region into a second polysilicon layer and the amorphous silicon layer in the display region to a third polysilicon layer, wherein the second polysilicon layer has an average grain size greater than the third polysilicon layer.

2. The method of claim 1, wherein the step of forming a metallic layer over a portion of the amorphous silicon layer in the peripheral circuit region comprises:
    forming a mask layer over the amorphous silicon layer, wherein the mask layer has an opening that exposes a portion of the amorphous silicon layer in the peripheral circuit region; and
    forming a metallic layer over the exposed amorphous silicon layer.

3. The method of claim 2, further comprising removing the mask layer.

4. The method of claim 1, wherein the mask layer comprises a silicon oxide layer.

5. The method of claim 1, wherein the metallic layer comprises a nickel layer.

6. The method of claim 1, wherein the step of performing a crystallization process comprises performing a solid-phase crystallization process.

7. The method of claim 1, further comprising forming a buffer layer over the panel with the buffer layer being a stack layer comprising a silicon nitride layer and a silicon oxide layer.

8. A method of fabricating a low temperature polysilicon thin film transistor, comprising the steps of:
    forming an amorphous silicon layer over a panel having a display region and a peripheral circuit region;
    performing a metal induced crystallization process to transform the amorphous silicon layer in the peripheral circuit region into a first polysilicon layer;
    performing an excimer laser annealing process to transform the second polysilicon layer in the peripheral circuit region into a second polysilicon layer and the amorphous silicon layer in the display region into a third polysilicon layer, wherein the second polysilicon layer has an average grain size larger than the third polysilicon layer;
    patterning the second polysilicon layer to form a plurality of island polysilicon layers;
    forming a channel region and a doped source/drain region on each side of the channel region in the island polysilicon layers; and
    forming a gate over the channel regions.

9. The method of claim 8, wherein the step of performing a metal induced crystallization process comprises:
    forming a mask layer over the amorphous silicon layer, wherein the mask layer has an opening that exposes a portion of the amorphous silicon layer in the peripheral circuit region;
    forming a metallic layer over the exposed amorphous silicon layer; and
    performing a crystallization process.

10. The method of claim 9, further comprising removing the mask layer.

11. The method of claim 9, wherein the crystallization process comprises a solid-phase crystallization process.

12. The method of claim 9, wherein the mask layer comprises a silicon oxide layer.

13. The method of claim 8, wherein the metallic layer comprises a nickel layer.

14. The method of claim 8, further comprising:

forming a buffer layer over the panel with the buffer layer being a stacked layer comprising a silicon nitride layer and a silicon oxide layer.

15. The method of claim 8, wherein the step of patterning the second polysilicon layer comprises performing a doping operation.

16. The method of claim 11, further comprising forming a gate insulation layer over the island polysilicon layer and the buffer layer.

17. The method of claim 16, wherein the step of forming a channel region and a doped source/drain region on each side of the channel region in each island polysilicon layer comprises:

forming a first patterned photoresist layer over the gate insulation layer to expose the upper surface on each side of the island polysilicon layer; and performing a $p^+$ doping operation.

18. The method of claim 17, wherein after the step of performing a $p^+$ doping operation, further comprises removing the first patterned photoresist layer.

19. The method of claim 8, wherein the step of forming a channel region and a doped source/drain region on each side of the channel region in the island polysilicon layers, further comprises:

forming a second patterned photoresist layer over the panel to cover a portion of each island polysilicon layer and expose the upper surface on each side of the island polysilicon layer; and performing an $n^+$ doping operation.

20. The method of claim 19, further comprising removing the second patterned photoresist layer.

21. The method of claim 20, further comprising forming a gate insulation layer over the island polysilicon layers and the buffer layer.

22. The method of claim 21, further comprising:

forming a third patterned photoresist layer over the gate insulation layer to expose a portion of each island polysilicon layer close to the doped source/drain region; and performing an $n^-$ doping operation.

23. The method of claim 22, further comprising removing the third patterned photoresist layer.

24. The method of claim 8, further comprising:

forming an inter-layer dielectric over the panel;

forming a plurality of first openings through the interlayer dielectric and the gate insulation layer to expose the doped source/drain regions; and forming a plurality of source/drain contact metallic layers so that the source/drain contact metallic layer is electrically connected to the doped source/drain regions through various openings.

25. The method of claim 24, further comprising:

forming a passivation layer over the panel; and forming a second opening in the passivation layer to expose a portion of the source/drain contact metallic layer; and forming a pixel electrode over the second opening so that the pixel electrode and the source/drain contact metallic layer are electrically connected through the second opening.

26. The method of claim 25, wherein material constituting the pixel electrode comprises indium-tin oxide.

27. The method of claim 25, wherein material constituting the passivation layer comprises silicon nitride.

* * * * *